United States Patent [19]

Wolcott et al.

[11] 3,768,028

[45] Oct. 23, 1973

[54] A.C.-D.C. AMPLIFIER SYSTEM

[75] Inventors: Henry O. Wolcott, Chatsworth; Lynne B. Goldstein, W. Los Angeles, both of Calif.

[73] Assignee: Optimation, Inc., North Hollywood, Calif.

[22] Filed: Mar. 22, 1972

[21] Appl. No.: 236,883

[52] U.S. Cl. .......... 330/2, 330/9, 330/69, 330/85, 330/149, 330/151

[51] Int. Cl. .......... H03f 3/68

[58] Field of Search .......... 330/2, 9, 30 D, 69, 330/85, 149, 151

[56] References Cited

UNITED STATES PATENTS

| | | | |
|---|---|---|---|
| 2,988,702 | 6/1961 | Newbold | 330/69 X |
| 3,081,435 | 3/1963 | Miller | 330/9 |
| 3,509,460 | 4/1970 | Mizrahi | 330/9 |
| 3,436,675 | 4/1969 | Lunau | 330/25 X |
| 3,495,179 | 2/1970 | Moss | 330/2 |

FOREIGN PATENTS OR APPLICATIONS

| | | | |
|---|---|---|---|
| 620,140 | 3/1949 | Great Britain | 330/9 |

*Primary Examiner*—Roy Lake
*Assistant Examiner*—James B. Mullins
*Attorney*—Harry R. Lubcke

[57] ABSTRACT

A wide-band a.c., stable d.c., amplifier system employing a wide-band operational amplifier and an integrator-feedback high-gain essentially d.c.-amplifying operational amplifier. The system provides uniform gain over a wide band of frequencies, including low frequencies and d.c., with precise stability useful for instrumentation. Indication of abnormal operation is available.

9 Claims, 5 Drawing Figures

A.C.-D.C. AMPLIFIER SYSTEM

BACKGROUND OF THE INVENTION

This invention pertains to apparatus comprising a feedback amplifier system giving precisely the same amplification to a.c. and d.c. input signals.

An ideal amplifier must amplify input signals the same amount regardless of frequency, from direct current (an invariable voltage) through a relatively wide band of frequencies.

The typical amplifier of antiquity suffered severe lack of amplification at low frequencies and did not amplify an invariable voltage at all.

Modern amplifiers are better, but typically retain unequal amplification characteristics at low frequencies and d.c., or lack wide-band amplification for a.c.

Certain known amplifiers obtain relatively stabilized characteristics for a.c. amplification, but provide only reduced amplification for d.c. variations. Such performance will not serve for calibrating apparatus, where the gain is to be fixed regardless of whether the input signal is d.c. or any a.c. frequency over a wide band.

Chopper stabilized amplifiers are known, but these introduce intermodulation products at and near the chopper frequency.

Other compound amplifiers employ d.c. feedback amplifiers for gain stabilization, but there is no capacity for accurately maintaining gain over the complete range of from d.c. to a given maximum frequency.

Also, d.c. feedback has been employed for inserting a desired d.c. component in an otherwise all-a.c. signal; and for combining a.c. and d.c. signals where the amplifier has an a.c. gain of only one.

Another compound amplifier arrangement employs four operational amplifiers, all faced in a common direction with respect to the main input and output terminals. The effort is to restrain d.c. drift in two wide-band amplifiers connected in cascade by the functioning of two d.c. amplifiers similarly connected in cascade. The cut-off frequency of the second d.c. amplifier is to be properly chosen to obtain as little change in the frequency response of the system in the change of the amplifying path from the low frequency "d.c." signal path to the higher frequency, (wide-band) signal path.

SUMMARY OF THE INVENTION

By novel functioning of a low frequency amplifier of high stability upon a wide-band amplifier, a uniform degree of amplification, or gain, is obtained that is ideally independent of frequency, from d.c. to a maximum frequency in an intended range of frequencies.

This makes the amplifier system suitable for instrument applications, with a variation of gain of only the order of 100 parts per million over the whole frequency range. Devices of the prior art have often had variations of the order of 5 percent.

The invention is attained with a minimum of apparatus; mainly, two operational amplifiers, and certain resistors and capacitors. The latter accomplish an integrating function not found in the prior art.

DESCRIPTION OF THE PREFERRED EMBODIMENTS

Figure 1:
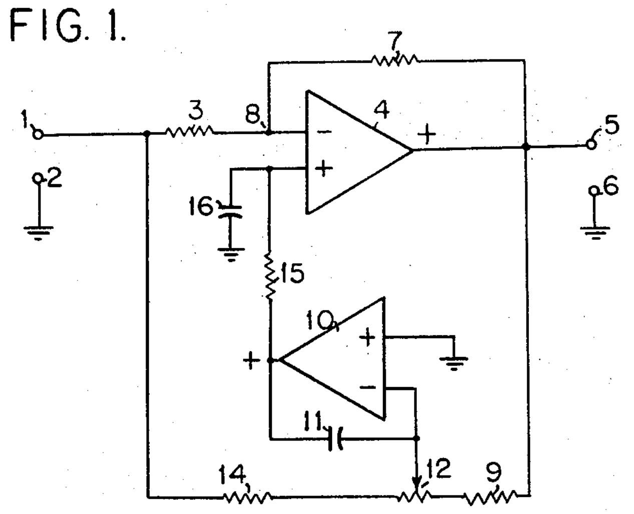
FIG. 1 is a schematic diagram for a typical embodiment of the invention.

In FIG. 1, numeral 1 identifies the signal input terminal. Alternating current (a.c.) signals and/or direct current (d.c.) signals are impressed between there and ground terminal 2.

Terminal 1 is connected to an isolating impedance 3, typically a resistor of the order of 2,000 ohms resistance, and therethrough to the inverting, "–," terminal of a.c.-d.c. wide-band amplifier 4. This may be a discrete-component amplifier having negative feedback, or an operational amplifier having a differential input and an open-loop gain of the order of 5,000, such as the RCA type CA 3030, or (preferably two in cascade) of the Fairchild type 733.

With the RCA amplifier the system of this invention is useful in instrumentation work to a maximum frequency of about one megahertz. The response of this amplifier is down 3 db at three magahertz. The Fairchild amplifiers provide a system of greater gain and frequency response in excess of ten megahertz. The amplifiers are down less than 3 db at 100 megahertz.

The amplified output is of "+," inverted, polarity with respect to the input polarity and the output terminal of the amplifier is directly connected to output terminal 5 of the system. The desired output signal is taken directly therefrom, with respect to ground terminal 6.

A resistive impedance 7, typically of 10,000 ohms resistance, is connected from the "+" output terminal to the "–" input terminal of amplifier 4. This provides negative feedback for this amplifier. The ratio of resistor 7 resistance to that of resistor 3 gives a close approximation to the gain of amplifier 4. Alternately, values of 100,000 and 2,000 would give a gain of 50. The common connection between resistors 3 and 7 is summing junction 8.

A second feedback loop includes d.c. amplifier 10. It starts with a connection from output terminal 5 and progresses through adjusting-means resistor 9 and potentiometer 12 to the slider thereof, and then to the "–" inverting input of d.c. amplifier 10.

Integrating means 11 is typically a capacitor of 0.25 microfarad capacitance. It is connected between the "–" input and the "+" output of d.c. amplifier 10.

Amplifier 10 may be of the chopper-stabilized type, such as the Analog Devices, Inc. model 233. This operational amplifier has an open loop gain of the order of ten million and a specification-sheet bandwidth extending up to 4 kilohertz. It is not used up to this frequency according to this invention because of the presence of integrating means 11. It is typically used from d.c. to an upper frequency that will give sufficiently rapid response of the system to dynamic operating conditions. This may be within the range of from less than one to approximately 50 hertz. The good overall stability of the chopper-stabilized amplifier is retained; i.e., 0.1 microvolt per degree Centigrade as to temperature stability and 2 microvolts per month as to time stability.

It is important to note that a chopper-stabilized amplifier may be used for amplifier 10 and still not entail intermodulation effects within the a.c. frequency spectrum, such as the previously recited disabilities of the prior art. This is because of the integrating functioning of amplifier 10, which results in the band-width thereof as used being only a small fraction of the designed band-width, thus far removed from the chopping frequency.

Alternately, a low-drift chopperless operational amplifier having an open-loop gain of up to one million may be used for amplifier 10, such as the integrated-circuit μA 725 type of Fairchild-semiconductor, Inc. The temperature stability of this amplifier is rated as 0.6 microvolt per degree Centigrade, with a bandwidth to 100 hertz full output. It has qualities similar to the chopper amplifier previously mentioned, but with inferior temperature stability, as noted.

With an amplifier of the differential input type, the non-inverting "+" input is grounded, as shown in FIG. 1.

Additionally, as to completing the whole of the adjustment means, another fixed resistor 14 is connected from the second terminal of potentiometer 12 directly to input terminal 1. Resistor 14 typically has a resistance of 20,000 ohms. The whole adjustment means thus has a resistance of the order of 120,200 ohms; resistor 9 being 100,000 ohms and potentiometer 12 being 200 ohms. These values are illustrative; the overall resistance of the adjustment means may be varied from approximate equality to the combined resistance of resistors 3 and 7 to approximately 20 times that value.

The relatively small resistance of potentiometer 12 is suggested to prevent serious misadjustment by unskilled service personnel. On the other hand, the range of this potentiometer must be sufficient to achieve the proper balance point for the input to amplifier 10. This is further discussed in considering the mathematical analysis of the amplifier. The d.c. amplifier feedback path is completed to the "+," non- inverting, input of amplifier 4 through typically resistive impedance 15, having a resistance of the order of 2,000 ohms.

This resistor prevents differential drift of amplifier 4, being involved in the input current thereto. For best performance of the amplifier system, amplifier 4 should have negligible input (bias) current flow. An amplifier having a field-effect input transistor meets this requirement, the input current to which is in the pico-ampere region ($10^{-12}$ amperes).

For an amplifier 4 having significant input current, such as in the microampere region ($10^{-6}$ amperes), it is important that a significant offset current not flow. This is to say that the input current flowing in each of the "−" and the "+" inputs to the amplifier be the same. This is desirable because the input currents change with temperature and the temperature stability of the amplifier system is thus degraded.

Accordingly, if resistors 3 and 15 have equal resistance, a significant input current can be accommodated and temperature stability will be retained. Further, if the inherent input current to each of the two inputs to amplifier 4 are unequal, the values of resistors 3 and 15 may be chosen to overcome this unbalance. The input with the large input current is provided with the small resistance value. If the input currents are negligible, then, of course, these resistors may have any resistance value as may be dictated by other aspects of the functioning of the amplifier.

It is desirable that the resistance value of resistor 3 be low, in order to provide the best frequency response for amplifier 4. A value of 2,000 ohms is considered low. However, the lower this value may be the lower the value of resistor 7 must also be to give a specified gain. The ultimate constraint on lowering this resistance occurs when the feedback resistor absorbs more power than is desirable to be dissipated in that part of the system.

It is to be understood that point 8 in the upper feedback network consisting of resistors 3 and 7 is equivalent to the slider point of potentiometer 12 of the lower feedback network. These points are to be at nearly the same relative potential. This is regardless of the fact that it is usual that the overall resistance of the 9, 12, 14 adjustment means have a value several times greater than the sum of the resistance of resistors 3 and 7 in order to minimize power dissipation.

Actually, variable potentiometer 12 may be placed at point 8 instead of the location shown in FIG. 1; or a potentiometer may be employed at each location. The constraint on the overall resistance of the 9, 12, 14 adjustment means is the magnitude of the input current required by amplifier 10. If this current is small, the overall resistance can be large. The power output capability of amplifier 4 determines the desirable resistance values for the feedback networks being considered; if this output is relatively large, then the resistances can be low.

Capacitor 16 is typically of 0.1 microfarad capacitance and is connected from the "+" input of amplifier to ground. It is employed with resistor 15 to eliminate, at the "+" input of amplifier 4, any residual amplitude of spurious a.c. signal that may arise from stray capacitive unbalance in adjustment means 9, 12, 14, at frequencies at which stray capacitance becomes effective. The addition of capacitive compensation to the adjustment means could possibly remove the requirement for elements 15 and 16, but the use of these elements is preferred.

In one application of this amplifier system, that of providing highly constant gain over a wide frequency range extending upward from d.c. in an a.c.-d.c. calibrating system devoid of other feedback, the input signal amplitude is 1 or 2 volts, with the output signal amplitude of the order of 10 volts. Other gains, of course, may be had.

The d.c. stability of the whole a.c.-d.c. amplifier and the uniformity of frequency response in the band from low frequencies to d.c. have been investigated mathematically. The novel improvements are demonstrated thereby, as well as being confirmed by the performance of the apparatus.

Considering first the d.c. stability, this is investigated by examining the magnitude of the d.c. offset present at output terminal 5 with respect to the noise voltage present at summing junction 8. Briefly, it is found that the offset is reduced by orders of magnitude, depending upon the gain of d.c. amplifier 10.

The ratio of the output voltage to the noise voltage at junction 8 is a measure of the d.c. stability, and is given by:

$$\frac{e_o}{e_n}=\frac{a_1}{1+\frac{a_1R_3}{R_3+R_7}+\frac{a_1a_2R_{14}}{R_9+R_{14}}} \qquad (1)$$

where:

$e_o$= output voltage at terminal 5

$e_n$= noise voltage at summing junction 8

$a_1$= gain of amplifier 4

$a_2$= gain of amplifier 10

The resistors are as identified in FIG. 1

In deriving this equation the input voltage at terminal 1 was considered to be zero. The result is thus the spurious d.c. present at output terminal 5, if any, due to the natural tendency of operational amplifier 4 to have d.c. instability. In passing, were amplifier 4 only present, equation (1) reduces to only the first two terms in the denominator, but the advantages of this invention are not then obtained as to the reduction of drift.

However, with amplifier 10 included according to the invention. and with a gain of as little as $10^4$ on open loop for the same, the spurious offset voltage at terminal 5 is reduced by a factor of $10^4$ of what it would be with amplifier 10 absent. The reduction of drift is thus approximately proportional to the gain of amplifier 10. When the gain thereof is large the stability of the system essentially becomes that of amplifier 10. Amplifiers may be constructed and are available commercially to serve as amplifier 10 which have stability orders of magnitude better than the stability of amplifiers available to serve as amplifier 4.

Considering now the uniformity of frequency response at low frequencies to zero frequency;i.e., to "d.c.," the transfer function $e_o/e_i$ for the whole amplifier is formed. By using Laplace's transform there is obtained:

$$\frac{e_o}{e_i}=\frac{\frac{a_1R_7}{R_3+R_7}}{1+\frac{a_1R_7}{R_3+R_7}}\cdot\frac{S^2+\frac{S}{R_{15}C_{16}}+\frac{R_3+R_7}{R_7R_{14}R_{15}C_{11}C_{16}}}{S^2+\frac{S}{R_{15}C_{16}}+\left(\frac{a_1}{1+\frac{a_1R_3}{R_3+R_7}}\right)\left(\frac{1}{R_9R_{15}C_{11}C_{16}}\right)} \qquad (2)$$

where, additionally:

$e_i$= input voltage at terminal 1

$S$ = Laplace operator, a complex frequency proportional to $j\omega$

The resistors and capacitors are as identified in FIG. 1

Considering equation (2); $a_1$ is usually always large with respect to unity, having a value of 2,000 to 5,000. Thus, unity may be neglected in the denominator of the first fraction and so the first fraction reduced to unity.

The second fraction of equation (2) is quadratic with respect to $S$ in both the numerator and the denominator. The first two terms thereof are identical. If the third terms in both the numerator and the denominator are equal, then the amplifier gain is independent of frequency. Frequency is a function of $S$.

Again, if $a_1$ is very large, the 1 in the denominator of the second term of the denominator of the second fraction may be ignored. This term then simplifies to $(R_3+R_7)/R_3$. Combining terms in the first and second parentheses of the last denominator term, it is seen that this will be identical to the last term in the numerator of the second fraction if $R_7=R_9$ to simplify the mathematics, and as also can be accomplished in practice. The whole of equation (2) then becomes unity. Such a condition is obviously independent of frequency. Thus, the response of the amplifier system is uniform in amplitude (i.e.,"flat") to and including d.c.

The above analysis presupposed $a_1$ to be very large. To the small extent that this is not true, a small adjustment of the resistance of $R_9$ is provided in the form of variable potentiometer 12 in FIG. 1.

To determine what resistance $R_9$ should have, the third term in the numerator of the second fraction of equation (2) is set equal to the third term in the denominator of the second fraction of equation (2) and the result is solved for $R_9$; i.e.:

$$R_9=(a_1R_7R_{14})/R_7+R_{15}(1+a_1) \qquad (3)$$

For a representative set of values:

$R_{14}=R_{15}=$ 2,000 ohms and $R_7=$ 10,000 ohms, thus a closed loop gain of amplifier 4 of five.

For these values the value of $R_9$ becomes slightly less than 10,000 ohms for values of $a_1$ less than infinity, as follows. If the value of $a_1$ = 2,000, then $R_9$ = 9,970 ohms. If $a_1$=5,000, $R_9$=9,988 ohms.

The adjustment of vernier potentiometer 12 makes makes this proper balance possible; an adjustment of ½ percent or less of the value of $R_9$. This resistor itself should be slightly less than 10,000 ohms, say 9,900 ohms, to make it possible to reach the exact values given above, depending upon the value of $a_1$ involved.

Very significantly, it has been noted that when the adjustment of $R_{12}$ is properly made for zero d.c. offset voltage at the output, the flat frequency response from low frequencies to d.c. is also obtained at the same setting. Since the offset adjustment can be made with a sensitive voltmeter, the more involved adjustment of flat frequency response need not be separately made. This flatness is also predicted by the mathematics.

Constant gain irrespective of time is an important requirement of instrument-type amplifiers and herein this is accomplished by means of negative feedback. With an open loop gain of at least 1,000 and a closed loop gain of 10, 40 db of feedback is provided, giving an improvement in stability of 100 times over that of the amplifier without feedback. Additionally, time-stable resistors are preferably employed in the amplifier, which further contribute to the long-time stability of the system.

When amplifier 4 is operated wide-band, as over a useful range of from d.c. to 1 megahertz, desired stability at d.c. cannot be obtained from that amplifier alone because of the relatively high input current required in the input stage under wide-band operating conditions. How equality of resistance for resistors 3 and 15 prevents spurious offsets at the output has previously been treated. The d.c. stability of the system is brought to the high degree of perfection desired of instrumentation amplifiers by the functioning of the feedback loop containing amplifier 10. This loop senses the d.c. offset at output terminal 5 and provides an input to the "+" input of amplifier 4 such as to eliminate such an offset unless the same is present at input terminal 1. That is, d.c. may be amplified by the system, since such would be present at terminal 1, but spurious d.c. values at the output terminal 5 are eliminated.

In order to obtain the superior performance of an extremely flat frequency response over the range of actual operation, decades greater nominally flat frequency response is required.

A Gaussian roll-off of response is arranged. If the operating portion of the response is to, say, 100 kilohertz with a flatness of 0.05 percent, the amplifier must also be flat to within 5 percent to 1 megahertz. The initial Gaussian roll-off is very slow, and in this example near 1 megahertz it approaches 6 db per octave. For small changes in response a square-law variation holds; if the amplitude response is down 0.05 percent at 100 kilohertz, at 200 kilohertz it is down 0.2 percent, at 400 kilohertz it is down 0.8 percent, etc. With the Gaussian roll-off the system is stable under loading conditions. The curve approaching the 3 db corner is gradual and this corner must be of the order of 25 times the maximum frequency of operation for the precision of flatness achieved herein. This technique is much more demanding than the usual high-fidelity flatness requirement of a few percent over the operating range.

In the operation of the amplifier system only a small a.c. signal voltage appears at summing junction 8; i.e., the variable $e_i$ in equation (2). This is in addition to the "noise voltage" in the mathematical analysis, which noise voltage is of much lesser amplitude than the signal voltage. The noise voltage is significantly the d.c. offset component in this analysis. The current flow through feedback resistor 7 causes the signal voltage at point 8 to be very small. Thus is the output voltage at terminal 5 divided by the gain of amplifier 4; i.e., if these values are 5 volts and 5,000 times, respectively, the voltage at point 8 is 1 millivolt. If these values are 5 volts and 1,000 times, the voltage is 5 millivolts. This assumes that there is no voltage on the "+" input terminal of amplifier 4.

The amplifier system desirably has substantially zero source impedance to the load connected to output terminals 5 and 6. This is accomplished in view of the negative feedback employed. Assuming that the impedance of the output of the amplifier system would otherwise be 100 ohms; with 60 db of feedback this value is divided by 1,000 times. The effective output impedance is then 0.1 ohm, or substantially negligible.

Even this can be reduced to zero by additional positive current feedback, should such precision be required. The positive current feedback can be arranged to originate across a resistor of low ohmage value that is placed in series with the low potential side of the power supply. The voltage drop across the same is summed at point 8. For d.c. signals no such regulation is required, since the gain of amplifier 10 approaches infinity as a practical matter and the output impedance at 5 is correspondingly essentially zero.

In an alternate method of adjusting the amplifier system for proper operation, potentiometer 12 is adjusted for zero a.c. signal voltage at the output of amplifier 10; at, say, a low frequency of the order of 10 hertz. When this is done the elimination of spurious d.c. offset at the output 5 and a flat frequency response at low frequencies to d.c. are simultaneously achieved, as has been previously theoretically demonstrated and has been comfirmed in practice.

The functioning by which any spurious d.c. offset is eliminated at output terminal 5 may be explained as follows. Assume at output terminal 5 the sudden appearance of an offset d.c. voltage of + 1 volt. At zero a.c. signal at the slider of potentiometer 12 there then appears a d.c. voltage of the order of + 0.2 volt. This reduction in voltage is because of the ratio of the resistances of resistors 9 and 14. The + 0.2 volt d.c. is an input signal to amplifier 10. As rapidly as integrating capacitor 11 can be charged, a negative voltage of the order of − 0.2 volt occurs at the output of amplifier 10. This is passed on to the + input of a.c. amplifier 4, which then eliminates the offset at its output, terminal 5.

Amplifier 10 has a gain of a million or more on open loop and does not have any offset as a chopper amplifier, or any appreciable offset which cannot be adjusted out if not of the chopper type. The action of this amplifier tends to make the difference in its signal inputs zero because of negative feedback. The "+" input thereof is grounded; i.e., it is at zero potential.

A chopper amplifier used for amplifier 10, having an open loop gain to ten to one-hundred million, controls the zero d.c. offset desired at output terminal 5 very satisfactorily. This d.c. control does not depend upon the ratio of resistors 9,12,14. The resistance values thereof may vary as to be expected in practice and still zero output for d.c. is maintained at output terminal 5. Should these resistors vary in resistance value the d.c. gain and the gain at low frequencies will be affected, but not the zero offset.

It will be recognized that amplifier 10 need be only a small signal amplifier. It handles only a correction signal and supplies this to the input of amplifier 4.

Conversely, amplifier 4 may have a high power output, if required, even into the kilowatt range. Still, an operational amplifier for amplifier 10 is capable of exercising the necessary control.

The practical effect of the control of amplifier 10 upon the system is significant. When it is removed from the circuit a change in line voltage on the power supply involved, a mechanical shock, or heating of component parts of the system will cause variations in the d.c. offset at output terminal 5. With control amplifier 10 replaced in the circuit the effect of these conditions upon the offset is very greatly reduced.

In addition to the application of the amplifier system of this invention to instrument apparatus, it is also very well suited for use as oscilloscope amplifiers. This is because of the highly uniform frequency response down to zero frequency (d.c.) and a corresponding lack of low frequency phase shift.

Instead of the previously identified operational amplifiers for a.c. - d.c. amplifier 4, the amplifier set forth in the Wolcott U.S. Pat. No. 3,361,981, issued Jan. 2, 1968, entitled "Ultra-linear D.C. Amplifier," is fully suitable, as long as the offset of the quiescent d.c. level is removed, as in FIG. 4 herein, to be later described.

Figure 2:
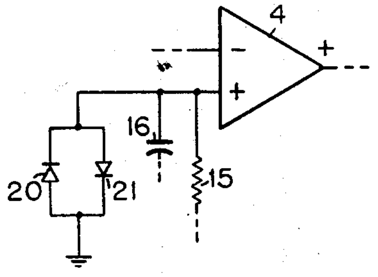
FIG. 2 is an alternate fragmentary diagram for limiting excessive voltage swings at one input of the a.c.-d.c. wide-band amplifier.

In the fragmentary alternate diagram of FIG. 2, amplifier 4, resistor 15 and capacitor 16 are shown to key this figure to the complete schematic diagram of FIG. 1. In this alternate embodiment, two diodes 20 and 21 are oppositely connected as to polarity between the "+" input of amplifier 4 and ground. These are preferably of the germanium type, having a threshold for conduction of 0.35 volt. Alternately, the silicon type could be used with a threshold for conduction of 0.6 volt. Accordingly, a signal bypass having a peak-to-peak extent of either 0.7 or 1.2 volts is provided. This accommodates all usual signal amplitudes, but limits extreme excursions, such as are primarily occasioned by turning the system on or off, or because of mementary malfunction or excessive input to the system.

Figure 3:
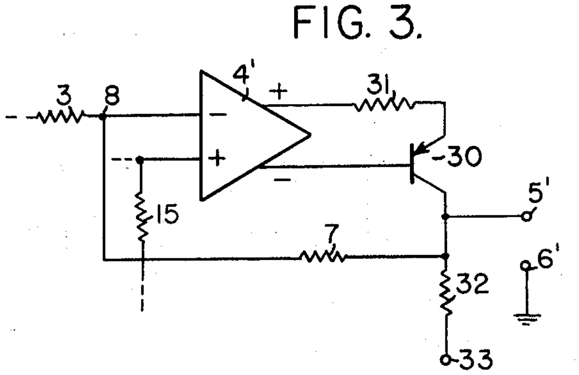
FIG. 3 is an alternate fragmentary diagram providing increased gain with an a.c.-d.c. amplifier having a differential output with an offset voltage, as well as a differential input.

FIG. 3 fragmentarily shows an alternate embodiment of the system of FIG. 1 in which an additional transistor 30, as a PNP type 2N3250, is used in conjunction with a differential input and output a.c. - d.c. amplifier 4'.

The purpose of transistor 30 is primarily to remove the usual d.c. offset voltage of typically +3 volts from the "+" and "—" outputs of amplifier 4'. This amplifier is adjusted to draw a current of three milliamperes at the collector of transistor 30. With resistor 32 at 2,000 ohms, this results in the potential at output terminal 5' being zero, as desired.

Additionally, a two-fold increase in gain is obtained with this alternate, since the effect of signal voltages of opposite polarity applied to the emitter and the base doubles the output of the transistor over the normal one-input-terminal and ground configuration.

Considering FIG. 3 in detail, elements 3,8,15. etc. are as in FIG. 1. The "+" differential output of amplifier 4' is now connected to resistor 31, of 10 to 100 ohms to enhance stability of the circuit, and therethrough to the emitter of transistor 30. The previously absent "—" output of amplifier 4' is connected directly to the base of transistor 30; the collector of which is connected directly to output terminal 5', this being essentially the same terminal as 5 previously identified. The collector is also connected to resistor 32, of 2,000 ohms, and therethrough to terminal 33, which is supplied with a source of electric power at a d.c. potential of —6 volts, typically. It will be understood that amplifiers 4 and 10 are in each embodiment connected to power supplies appropriate to the exact type of amplifier used. Since such connections are known these have not been shown.

Figure 4:
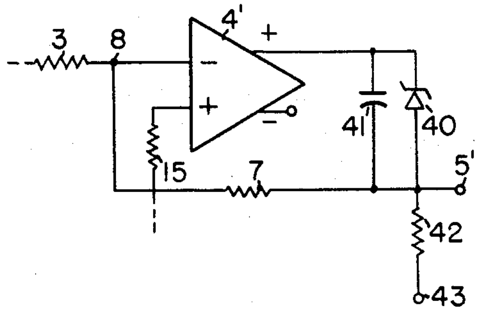
FIG. 4 is a similar alternate fragmentary diagram for removing an output voltage offset without an increase in gain.

Fragmentary FIG. 4 is similar to FIG. 3, except that the transistor 30 is absent, being replaced in part by zener diode 40 and capacitor 41. Both of these elements are connected from the "+" output of amplifier 4' to the output terminal 5'. The zener diode typically has a voltage rating of 3.3 volts, and the capacitor a capacitance of 10 microfarads. The anode of zener diode 40 is connected to resistor 42, of 2,000 ohms, and therethrough to terminal 43, which is supplied with typically a potential of — 6 volts from d.c. power supply means not shown.

The negative ("—") output of amplifier 4' is not used and remains unconnected. A current through resistor 42 is arranged to bring the resting potential of output terminal 5' to zero volts d.c. Capacitor 41 absorbs the "noise" generated by the zener diode in its usual manner of functioning.

Figure 5:
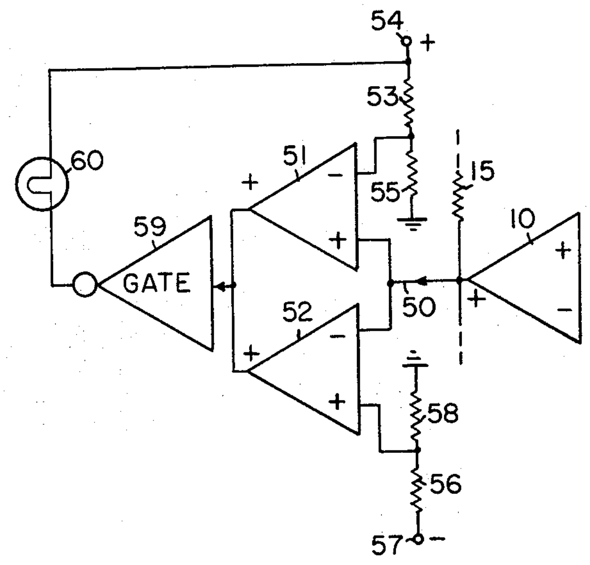
FIG. 5 is a further alternate fragmentary diagram, which includes an indicator of the functioning of the amplifier system of this invention.

FIG. 5 is fragmentary as to the whole amplifier system according to this invention, but is complete as to relatively simple additions which give a human-sensible indication of the functioning of the system. Briefly, a visual indication is given for system functioning which causes amplifier 10 to go to saturation in attempting to control an abnormality; this may be either a malfunctioning of the system, or overloading its input or output.

In addition to all of the prior connections to amplifier 10 shown in FIG. 1, of which resistor 15 is illustrative in FIG. 5, an additional connection 50 is taken from the "+" output of amplifier 10. This connects to the "+" input (non-inverting) of amplifier 51 of a dual voltage type 711 comparator, such as is manufactured by Fairchild Semiconductor Corporation and others. Connection 50 also connects to the "—" input (inverting) of amplifier 52 of the same dual comparator. Two amplifiers are employed so that both excessive positive or negative excursions can be sensed.

The negative input to amplifier 51 is connected to the common connection between voltage-divider resistors 53 and 55. The former is also connected to terminal 54, which is provided with a power supply output, such as 12 volts d.c. of positive polarity with respect to ground. Latter resistor 55 is connected to ground. Typically, resistor 55 has only one-third the resistance of resistor 53, so that a voltage of the order of "+" three volts is maintained at the negative input to amplifier 51.

A symmetrical but opposed polarity circuit arrangement to that above-described is connected to the "+" input of amplifier 52. Terminal 57 is typically connected to a power source of — 6 volts and to one end of resistor 56. The latter is connected to resistor 58 and series-wise to ground. The connection to the "+" input of amplifier 52 is taken from the common connection between the resistors. The potential sought on this connection is normally equal but opposite to that at the "—" input of amplifier 51. For purely practical reasons having to do with the manufactured 711 comparator, the negative power voltage is half that of the positive power voltage supply. Thus, resistors 56 and 58 have equal resistance to obtain the selected —3 volts input to amplifier 52.

The "+" outputs of amplifiers 51 and 52 are connected together and to the input of inverting gate 59. The output thereof is connected to indicator lamp 60, which may be of the incandescent type. The second terminal of the lamp is connected to the full positive voltage at terminal 54 for energization.

In operation, the circuit of FIG. 5 in coaction with that of FIG. 1, provides that lamp 60 be illuminated for any condition that causes amplifier 10 to go to either positive or negative saturation at the output. For a catastrophic or semi-catastrophic failure in or associated with amplifier 4, which amplifier 10 is incapable of overcoming even by a swing to positive or negative saturation, lamp 60 lights. Similarly, when the input at terminal 1 is excessive, such that the output at terminal 5 is no longer proportional to the input amplitude, amplifier 10 is incapable of correcting the same because of saturation of amplifier 4, so amplifier 10 goes to saturation, also lighting lamp 60.

The lamp lights for excessive output from amplifier 10 because this results in a positive-going output (logical 1) from either of amplifiers 51 or 52. Such an input to inverting gate 59 gives a negative-going output (logical 0) to lamp 60. This lowers the potential at the output of gate 59 to essentially zero, or ground, and so the lamp lights, being permanently connected to positive terminal 54 and floating at that potential when a logical 0 is not provided by gate 59.

It is not necessary that the threshold of operation of the comparator be 3 volts. Other values may be chosen as long as these are greater than millivolt levels.

One example of overload of the system occurs when the input is so great at terminal 1 that amplifier 4 clips off the negative peaks of an alternating current waveform. This causes a residual d.c. component at output terminal 5. When this exceeds that value at which amplifier 10 can no longer compensate for the situation, the saturated condition of amplifier 10 causes lamp 60 to light.

Returning to the amplifier per se, in the adjustment of any of the embodiments, the a.c. and d.c. closed loop gains are made equal by the null setting of the slider on potentiometer 12.

While d.c. and relatively low frequency control with integration is typical functioning according to this invention, this can be modified by extending the control upward in frequency to enable control amplifier 10 to provide zero output impedance for the system, notably amplifier 4.

With, say, a transformer output at terminals 5,6; should amplifier 4 become loaded more heavily, the control action of amplifier 10 brings amplifier 4 back to the prior state. Suitable adjustment of the operating parameters provides effectively zero output impedance, or a value of output impedance near the zero value as may be desired.

This functioning takes place from d.c. to the maximum frequency of operation of amplifier 10. This parameter is controlled herein by the capacitances of capacitors 11 and 16, along with the inherent maximum frequency of amplification of amplifier 10. This maximum frequency may be termed the "cross-over" frequency, but the usual mode of operation associated with this term does not take place in this system. Amplifier 10 controls amplifier 4, there is no exchange of signal paths. For higher frequencies of operation of amplifier 10 the capacitances of capacitors 11 and 16 are decreased.

Specific component values have been given herein to most fully, clearly and concisely teach the invention. These values are amenable to moderate alteration without departing from operability according to this invention.

I claim:

1. Apparatus for equally amplifying alternating and invariable voltages, comprising;

a. an a.c. - d.c. wide-band amplifier (4), having differential inverting and non-inverting inputs and an output (5), b. adjustment means (9,14), connected between the signal input terminal of said apparatus feeding said inverting input and the output of said a.c. - d.c. amplifier, c. a d.c. amplifier (10), having an input continuously connected to said adjustment means and having an output connected to said non-inverting input of said a.c. - d.c. amplifier, and d. integrating means (11), connected across said d.c. amplifier, whereby said d.c. amplifier is constituted to amplify invariable and slowly varying voltages for the control of said a.c. - d.c. amplifier (4).

2. Apparatus according to claim 1, in which said integrating means is comprised of;

a. a capacitor (11), connected between the input and the output of said d.c. amplifier (10).

3. Apparatus according to claim 1, which additionally includes;

a. a resistor (15), connected between the output of said d.c. amplifier (10) and the non-inverting input of said a.c. - d.c. amplifier (4), and b. a capacitor (16), connected between the non-inverting input of said a.c. - d.c. amplifier (4) and ground.

4. Apparatus according to claim 1, in which said adjustment means is comprised of;

a. a voltage divider, connected between the output terminal (5) and the input terminal (1) of said apparatus, and b. an adjustable tap (12), on said voltage divider is continuously connected to an inverting input terminal ("—") of said d.c. amplifier (10).

5. Apparatus according to claim 1, in which;

a. said d.c. amplifier (10) in relation to said integrating means (11) is constituted to have an upper frequency limit of amplification within the range of from less than one to approximately fifty hertz, whereby fidelity of output with respect to d.c. offset is obtained at the output (5) of said apparatus.

6. Apparatus according to claim 1, in which;

a. said d.c. amplifier (10) in relation to said integration means (11) is constituted to have an upper frequency limit of amplification that is a significant fraction of the upper frequency limit of amplification of said a.c.-d.c. amplifier (4), whereby effective zero output impedance of the system is secured through the control of said a.c.-d.c. amplifier by said d.c. amplifier.

7. Apparatus according to claim 1 which additionally includes;

a. a differential output to said a.c. - d.c. amplifier (4'), b. one transistor (30) connected to said differential output, and c. a resistor (32) connected to said transistor and to a source of electrical energy (33), whereby the resting potential at the connection between said transistor and resistor is different from that at the output of said a.c. - d.c. amplifier (4').

8. Apparatus according to claim 1 which additionally includes;

a. voltage-shifting means (40) connected between the output of said a.c. - d.c. amplifier (4') and the output (5') of the whole apparatus, and b. a resistor (42) connected to said voltage-shifting means and to a source of electrical energy (43) to eliminate d.c. offset at said output.

9. Apparatus according to claim 1 which additionally includes;

a. a voltage comparator (51, 52) having dual amplifying means separately operable on inputs of opposite polarity connected to the output of said d.c. amplifier (10), and b. an indicator circuit (59, 60) connected to said voltage comparator, whereby an indication is obtained upon an output from said d.c. amplifier in excess of a selectable threshold.

* * * * *